United States Patent
Wang et al.

(10) Patent No.: US 10,971,196 B1
(45) Date of Patent: Apr. 6, 2021

(54) SINGLE-ENDED SENSE AMPLIFIER

(71) Applicant: National Chung Cheng University, Chia-Yi (TW)

(72) Inventors: Jinn-Shyan Wang, Chia-Yi (TW); Chien-Tung Liu, Chia-Yi (TW)

(73) Assignee: NATIONAL CHUNG CHENG UNIVERSITY, Chia-Yi (TW)

( * ) Notice: Subject to any disclaimer, the term of this patent is extended or adjusted under 35 U.S.C. 154(b) by 0 days.

(21) Appl. No.: 16/854,124

(22) Filed: Apr. 21, 2020

(30) Foreign Application Priority Data

Feb. 19, 2020 (TW) .................................. 109105280

(51) Int. Cl.
*G11C 7/06* (2006.01)
*G11C 7/12* (2006.01)

(52) U.S. Cl.
CPC ................ *G11C 7/067* (2013.01); *G11C 7/12* (2013.01)

(58) Field of Classification Search
CPC .................................. G11C 7/067; G11C 7/12
See application file for complete search history.

(56) References Cited

U.S. PATENT DOCUMENTS 7,768,321 B2 * 8/2010 Chang .................... G11C 7/067
327/56
9,224,464 B2 * 12/2015 Chou ....................... G11C 7/12

* cited by examiner

*Primary Examiner* — Vanthu T Nguyen
(74) *Attorney, Agent, or Firm* — Muncy, Geissler, Olds & Lowe, P.C.

(57) ABSTRACT

A single-ended sense amplifier includes a virtual-supply voltage-adapted (VVDD-adapted) inverter circuit, a virtual-supply voltage-adapted (VVDD-adapted) voltage-level converter circuit (VLC), and a virtual-supply-voltage-adaptation circuit (VSVA). The single-ended sense amplifier receives a data signal input, a sensing-operation-enabling signal input, and a pre-charging control signal input to generate a final amplified signal output. There are a first virtual-supply node and a second virtual-supply node in the VVDD-adapted inverter circuit. There is a third virtual-supply node in the VVDD-adapted VLC. The VSVA connects both the first and third virtual supply voltage nodes. The output end of the virtual-supply voltage-adapted inverter circuit connects to the input end of the VVDD-adapted VLC.

28 Claims, 6 Drawing Sheets

SINGLE-ENDED SENSE AMPLIFIER

This application claims priority for Taiwan patent application no. 109105280 filed on 19 Feb. 2020, the content of which is incorporated by reference in its entirely.

BACKGROUND OF THE INVENTION

Field of the Invention

The present invention relates to a single-ended sense amplifier, particularly to a single-ended sense amplifier using adaptive virtual-supply voltages for ultra-low-voltage operation with low standby-leakage.

Description of the Related Art

Edge-computing system-on-chip for internet-of-things applications is usually battery-powered and heavily duty-cycled. They can become power and energy-efficient if low-voltage circuit design techniques are adopted. Memory is a significant source of power consumption in these systems. Many read-only memory (ROM) and static random access memory (SRAM) in low-voltage design tend to use the single-ported bit-cell structure and need a single-ended sense amplifier and the corresponding sensing and amplification method.

The single-ended sense amplifier in low-voltage design has two design styles. The first design style uses a static inverter as a sense amplifier. The trip point of the inverter determines the logic value of the accessed bit line (or data line) signal. The trip point is quite sensitive to process-voltage-temperature (PVT) variations, but reducing PVT-variation dependence is not easy. This effect limits the minimum supply voltage (Vmin). The second style adopts a differential sense amplifier with one input connected to the bit line (or data line) and the other to a fixed reference voltage. However, when facing severe PVT variations, the reference voltage needs careful off-chip calibration.

FIG. 1 shows a prior-art single-ended sense amplifier, which has one signal-input DIN and one control-input SAE. The selected bit line or the data line from the memory array connects to DIN, and SAE is the sense-amplifier-enabling signal. In the sense amplifier, the preceding stage 11 is an inverter with its trip-point and the virtual supply voltage VVDD on the capacitor 110 being adjustable, and the latter stage 12 is a dynamic inverter playing as a voltage-level converter. FIG. 2 shows three operation phases of this prior-art single-ended sense amplifier. The first is the pre-charge phase, where DIN is pre-charged to the system supply voltage VDD by a pre-charge PMOS (not shown) in the memory array. In the meantime, SAE is low to pre-charge the capacitor 110 in stage 11 and the output SAO of the sense amplifier to VDD. Node O11 of the preceding stage 11 is pulled down. The second phase is for the virtual supply voltage adaptation of stage 11 by turning off the pre-charge PMOS. The voltages at DIN and capacitor 110 drop gradually due to the PVT- and pattern-dependent leakage of the bit line. The voltages finally stabilize between VDD and the ground voltage before the sense amplifier entering the third phase. In the third phase, one word-line (not shown) for accessing the bit cell and SAE are asserted high. When reading '1,' the voltage at DIN maintains at the same level as in the second phase. Therefore, the voltage at node O11 of stage 11 keeps low and the output SAO of the sense amplifier keeps high without any access delay. When reading '0,' the voltage at DIN goes low to turn on PMOS device 112 and turn off NMOS device 113. The turned-on device 112 induces a charge-sharing effect between the virtual power supply node and node O11. The charge-sharing effect brings some charges at capacitor 110 onto node O11 so that the voltage at O111 rises. The pulled-up voltage at O11 should be high enough to turn on NMOS device 122 in order to pull down the voltage at SAO. There is a long access delay for reading '0'. Therefore, the access delay of reading '0' limits the operation speed of the sense amplifier.

As mentioned above, the virtual supply voltage VVDD of the inverter formed by devices 112 and 113 stabilizes at the end of the second phase. The supply voltage adaptation deals with the problem caused by the PVT- and pattern-dependent leakage before distinguishing the real signals of reading '0' and reading '1'. The efficiency of the supply voltage adaptation depends on the size of the PMOS device 111 and the capacitance value of the capacitor 110. Increasing the size of the PMOS device 111 or decreasing the capacitance of capacitor 110 can increase the adaptation speed and elevate the level of the adapted supply voltage.

Note that reading '0' is more critical than reading '1' because the pulled-up voltage at O11 should be guaranteed high enough against severe PVT variations. As mentioned above, reading '0' induces the charge sharing effect in the third phase. However, the charge-sharing effect brings about a degraded virtual supply voltage. The degraded virtual supply voltage, in turn, degrades the "high" output voltage at node O11. The charge stored in the capacitor may also get lost due to the leakage current through the parasitic PN-junction diodes so as to degrade the virtual supply voltage further. These effects are either harmful to the operation speed of the dynamic stage 12 or even result in a sensing failure. Usually, a high-Q capacitor, such as the metal-to-metal (MOM) capacitor, can be used to assist the charge holding. On the other hand, one can increase the area of the capacitor to increase the number of charges stored on capacitor 110 to improve the circuit's reliability. However, the concern on the area overhead and the declined capability of the virtual supply voltage adaptation speed hint a demand to explore a better circuit solution.

SUMMARY OF THE INVENTION

The primary objective of the present invention is to provide a single-ended sense amplifier. With the new circuit design of mutually adapting virtual-supply voltages, the single-ended sense amplifier of the present invention achieves higher operation reliability, higher operation speed, lower minimum supply voltage, and lower standby leakage with a small number of transistors used.

To overcome the abovementioned problems, the present invention provides a single-ended sense amplifier performing a first operation phase, a second operation phase, and a third operation phase and comprising: a virtual-supply-voltage-adapted inverter circuit, coupled to a data line of a memory array, having a first virtual-supply node and a second virtual-supply node, receiving a data signal input from the data line of the memory array and a sensing-operation-enabling signal input, and generating a pre-amplified signal output; a virtual-supply-voltage-adapted voltage-level converter, coupled to the virtual-supply-voltage-adapted inverter circuit, having a third virtual-supply node, receiving the pre-amplified signal output of the virtual-supply-voltage-adapted inverter circuit, a pre-charging control signal input being the same as a control signal input of a pre-charging data-line load of the memory array, and the sensing-operation-enabling signal input, and generating a final amplified signal output; and a virtual-supply-voltage-adaption circuit receiving the sensing-operation-enabling signal input to link or to dis-link the first virtual-supply node of the virtual-supply-voltage-adapted inverter circuit and the third virtual-supply node of the virtual-supply-voltage-adapted voltage-level converter. In the first operation phase, the pre-charging control signal input is asserted, the sensing-operation-enabling signal input is di s-asserted, the virtual-supply-voltage-adapted inverter circuit pre-charges its own the first virtual-supply node to a system supply voltage, the virtual-supply-voltage-adaption circuit is turned off to dis-link the first virtual-supply node of the virtual-supply-voltage-adapted inverter circuit and the third virtual-supply node of the virtual-supply-voltage-adapted voltage-level converter, and the virtual-supply-voltage-adapted voltage-level converter pre-charges its own the third virtual-supply node to the system supply voltage. In the second operation phase, the pre-charging control signal input is dis-asserted, the sensing-operation-enabling signal input is asserted, the virtual-supply-voltage-adapted inverter circuit adapts its own virtual-supply-node voltage in accordance with the data signal input being subject a leakage current of the data line, the virtual-supply-voltage-adaption circuit is turned off to dis-link the first virtual-supply node of the virtual-supply-voltage-adapted inverter circuit and the third virtual-supply node of the virtual-supply-voltage-adapted voltage-level converter, and the virtual-supply-voltage-adapted voltage-level converter keeps its own virtual-supply-node voltage at the system supply voltage. In the third operation phase, the pre-charging control signal input is dis-asserted, the sensing-operation-enabling signal input is asserted, the virtual-supply-voltage-adapted inverter circuit senses and pre-amplifies the data signal input in accordance with data stored in an accessed memory bit-cell of the memory array to generate the pre-amplified signal output, the virtual-supply-voltage-adaption circuit is turned on to link the first virtual-supply node of the virtual-supply-voltage-adapted inverter circuit and the third virtual-supply node of the virtual-supply-voltage-adapted voltage-level converter, and the virtual-supply-voltage-adapted voltage-level converter adapts its own virtual-supply-node voltage in accordance with the data signal input and the data stored in the accessed memory bit-cell and senses and amplifies the pre-amplified signal output from the virtual-supply-voltage-adapted inverter circuit to generate the final amplified signal output.

In an embodiment of the present invention, the inverter circuit comprises a first P-channel metal-oxide-semiconductor field effect transistor (PMOSFET), a second P-channel metal-oxide-semiconductor field effect transistor (PMOSFET), a third P-channel metal-oxide-semiconductor field effect transistor (PMOSFET), and an N-channel metal-oxide-semiconductor field effect transistor (NMOSFET) that collectively form a cascade down to ground.

In an embodiment of the present invention, the source terminal, the gate terminal, and the drain terminal of the first PMOSFET receive the system supply voltage, the pre-charging control signal input, and the data signal input, respectively.

In an embodiment of the present invention, the source terminal and the gate terminal of the second PMOSFET respectively receive the data signal input and the sensing-operation-enabling signal input, and the drain terminal of the second PMOSFET connects to a source terminal of the third PMOSFET.

In an embodiment of the present invention, the source terminal and the drain terminal of the third PMOSFET respectively connect to the drain terminal of the second PMOSFET and the drain terminal of the NMOSFET, and the gate terminal of the third PMOSFET receives the data signal input.

In an embodiment of the present invention, the source terminal and the drain terminal of the NMOSFET respectively connect to ground and the drain terminal of the third PMOSFET, and the gate terminal of the NMOSFET receives the data signal input.

In an embodiment of the present invention, the first virtual-supply node is the drain terminal of the second PMOSFET and the second virtual-supply node is the drain terminal of the first PMOSFET of the inverter circuit.

In an embodiment of the present invention, the signal output node of the inverter circuit is the drain terminal of the NMOSFET, and the signal output node generates the pre-amplified signal output in the third operation phase.

In an embodiment of the present invention, the inverter circuit comprises a first P-channel metal-oxide-semiconductor field effect transistor (PMOSFET), a second P-channel metal-oxide-semiconductor field effect transistor (PMOSFET), and an N-channel metal-oxide-semiconductor field effect transistor (NMOSFET), which collectively form a cascade down to ground.

In an embodiment of the present invention, the source terminal and the gate terminal of the first PMOSFET respectively receive the data signal input and the sensing-operation-enabling signal, and the drain terminal of the first PMOSFET connects to the source terminal of the second PMOSFET.

In an embodiment of the present invention, the source terminal and the drain terminal of the second PMOSFET respectively connect to the drain terminal of the first PMOSFET and the drain terminal of the NMOSFET, and the gate terminal of the second PMOSFET receives the data signal input.

In an embodiment of the present invention, the source terminal and the drain terminal of the NMOSFET respectively connect to ground and the drain terminal of the second PMOSFET, and the gate terminal of the NMOSFET receives the data signal input.

In an embodiment of the present invention, the first virtual-supply node is the source terminal of the second PMOSFET and the second virtual-supply node is the source terminal of the first PMOSFET.

In an embodiment of the present invention, the signal output node of the inverter circuit is the drain terminal of the NMOSFET, and the signal output node generates the pre-amplified signal output in the third operation phase.

In an embodiment of the present invention, the voltage-level converter comprises a first P-channel metal-oxide-semiconductor field effect transistor (PMOSFET), a second P-channel metal-oxide-semiconductor field effect transistor (PMOSFET), and an N-channel metal-oxide-semiconductor field effect transistor (NMOS) that collectively form a cascade down to ground.

In an embodiment of the present invention, the source terminal and the gate terminal of the first PMOSFET respectively receive the system supply voltage and the pre-charging control signal input, and the drain terminal of the first PMOSFET connects to the source terminal of the second PMOSFET.

In an embodiment of the present invention, the source terminal and the drain terminal of the second PMOSFET respectively connect to the drain terminal of the first PMOSFET and the drain terminal of the NMOSFET, and the gate terminal of the second PMOSFET receives the sensing-operation-enabling signal input.

In an embodiment of the present invention, the source terminal, the gate terminal, and the drain terminal of the NMOSFET connect to ground, the signal output node of the inverter circuit, and the drain terminal of the second PMOSFET, respectively.

In an embodiment of the present invention, the third virtual-supply node of the voltage-level converter is the drain terminal of the first PMOSFET.

In an embodiment of the present invention, the signal output node of the voltage-level converter is the drain terminal of the NMOSFET, and the signal output node generates the final amplified signal output in the third operation phase.

In an embodiment of the present invention, the voltage-level converter comprises a first P-channel metal-oxide-semiconductor field effect transistor (PMOSFET), a second P-channel metal-oxide-semiconductor field effect transistor (PMOSFET), and an N-channel metal-oxide-semiconductor field effect transistor (NMOSFET) that collectively form a cascade down to ground.

In an embodiment of the present invention, the source terminal and the gate terminal of the first PMOSFET respectively receive the system supply voltage and the pre-charging control signal input, and the drain terminal of the first PMOSFET connects to the source terminal of the second PMOSFET.

In an embodiment of the present invention, the source terminal, the gate terminal, and the drain terminal of the second PMOSFET respectively connect to the drain terminal of the first PMOSFET, the signal output node of the inverter circuit, and the drain terminal of the NMOSFET.

In an embodiment of the present invention, the source terminal, the gate terminal, and the drain terminal of the NMOSFET respectively connect to ground, the signal output node of the inverter circuit, and the drain terminal of the second PMOSFET.

In an embodiment of the present invention, the third virtual-supply node of the voltage-level converter is the drain terminal of the first PMOSFET.

In an embodiment of the present invention, the signal output node of the voltage-level converter is the drain terminal of the NMOSFET, and the signal output node generates the final amplified signal output in the third operation phase.

In an embodiment of the present invention, the virtual-supply-voltage-adaptation circuit comprises an N-channel metal-oxide-semiconductor field effect transistor (NMOSFET).

In an embodiment of the present invention, the source terminal and the drain terminal of the NMOSFET respectively connect to the first virtual-supply node and the third virtual-supply node, and the gate terminal of the NMOSFET receives the sensing-operation-enabling signal input.

Below, the embodiments are described in detail in cooperation with the drawings to make easily understood the technical contents, characteristics and accomplishments of the present invention.

DETAILED DESCRIPTION OF THE INVENTION

Figure 1:
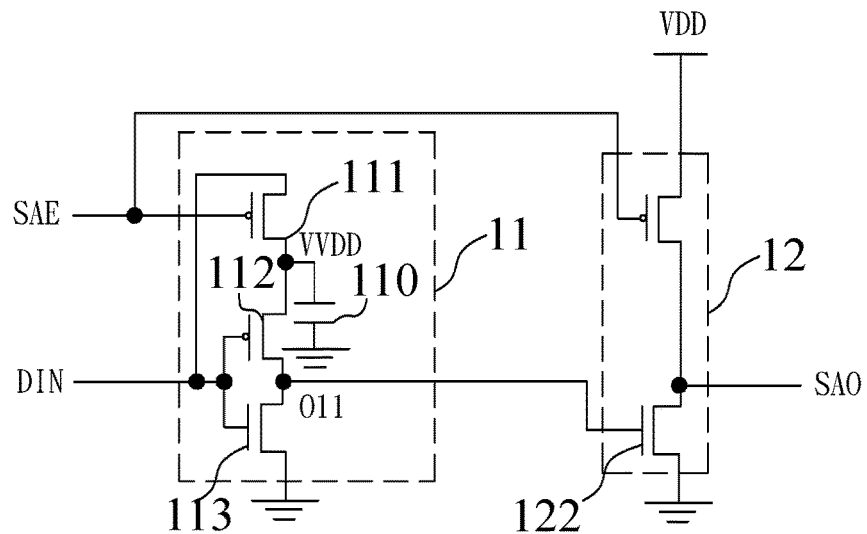
FIG. 1 is a diagram illustrating a single-ended sense amplifier in the conventional technology.
Figure 2:
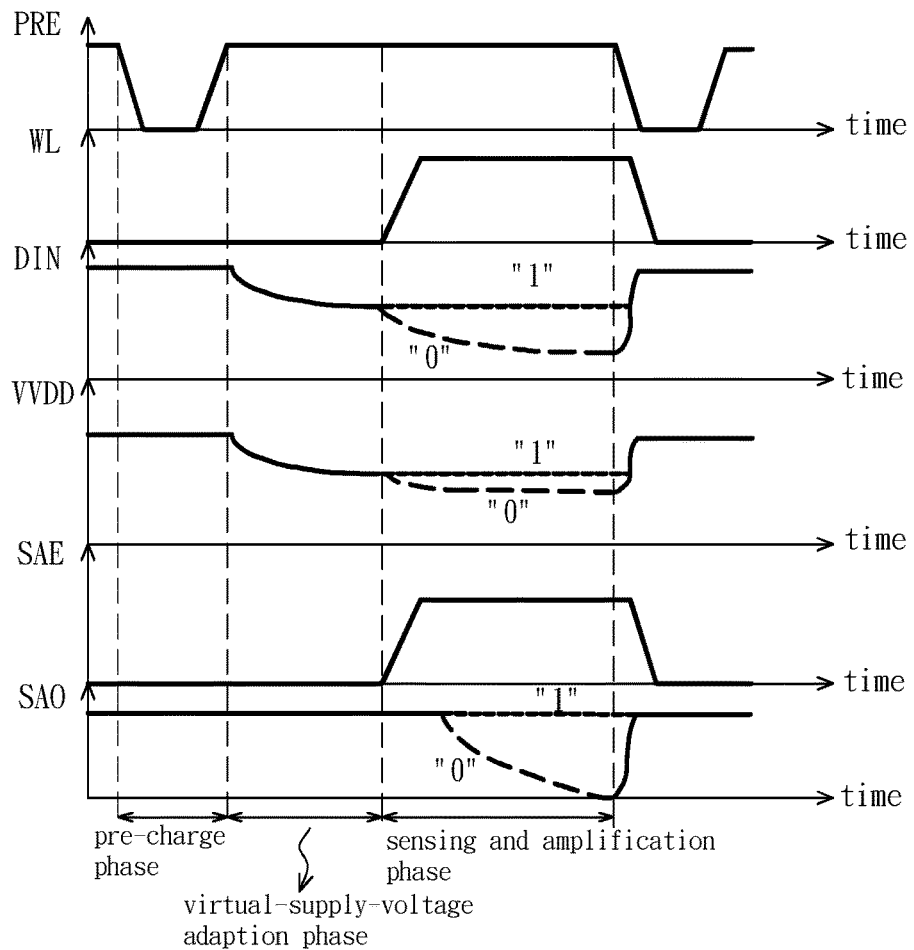
FIG. 2 is a diagram illustrating the waveforms of voltages of a single-ended sense amplifier in the conventional technology.
Figure 3:
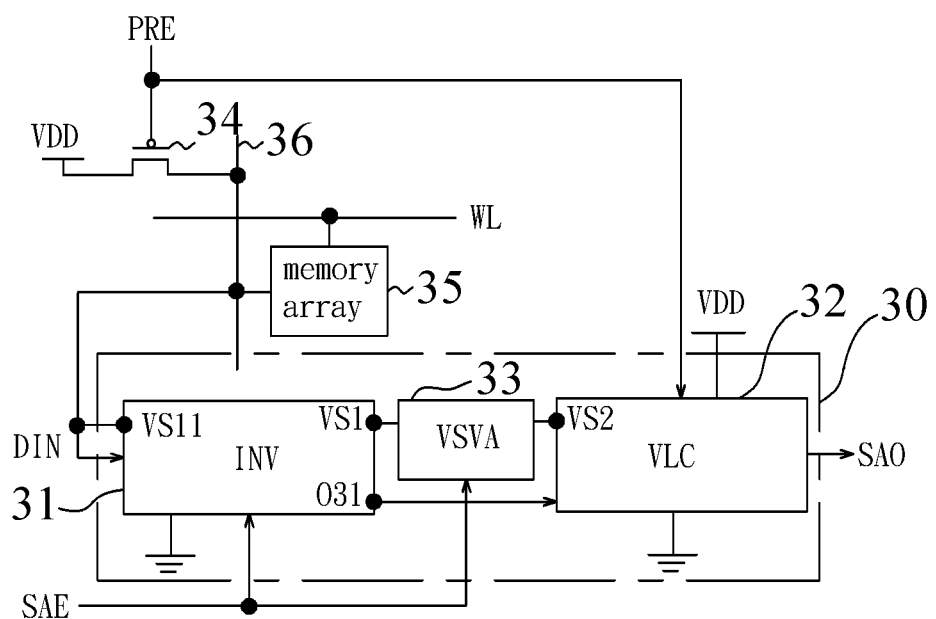
FIG. 3 is a diagram schematically illustrating a single-ended sense amplifier according to the first embodiment of the present invention.

FIG. 3 illustrates a sense amplifier in accordance with the present invention. The single-ended sense amplifier 30 comprises a virtual-supply-voltage-adapted inverter circuit (INV) 31, a virtual-supply-voltage-adapted voltage-level converter circuit (VLC) 32, and a virtual supply voltage adaptation circuit (VSVA) 33. The single-ended sense amplifier 30 has one data-input end DIN, one control-input end SAE, one control-input end PRE, and one data-output end SAO. The selected bit line or data line 36 from the memory array 35 connects to DIN. SAE accepts the sense-amplifier-enabling control signal. The control-input end PRE connects to the control signal for pre-charging the PMOS bit line load 34 of the memory array 35. The output end O31 of the inverter circuit 31 connects to the input end I32 of the VLC 32. The output end of the VLC 32, i.e., SAO, is also the data-output end of the single-ended sense amplifier 30.

The present invention designates the system power supply voltage as VDD and the system ground voltage as VSS. The system power supply voltage is a global and nominal supply voltage of an integrated circuit chip that the sense amplifier device 30 is disposed on. The system ground voltage is a global and nominal ground voltage (0V) of an integrated circuit chip that the sense amplifier device 30 is disposed on. In the present invention, circuits 31 and 32 can be powered down for reducing leakage power consumption in the standby mode. Thus, both circuits 31 and 32 have virtual power supply voltage nodes to realize power-down design. According to various embodiments, circuit 31 has a main virtual supply voltage node VS1 and a secondary virtual supply voltage node VS11, and circuit 32 has a main virtual supply node VS2. According to various embodiments, the secondary virtual supply voltage node VS11 of circuit 31 and DIN of the sense amplifier 30 are connected together. The present invention designates the virtual power supply voltage at VS1 as VVDD1 and the virtual power supply voltage at VS2 as VVDD2. The main virtual supply nodes VS1 of circuit 31 and VS2 of circuit 32 are connected through the virtual supply voltage-adaptation circuit (VSVA) 33 controlled by SAE.

Figure 4:
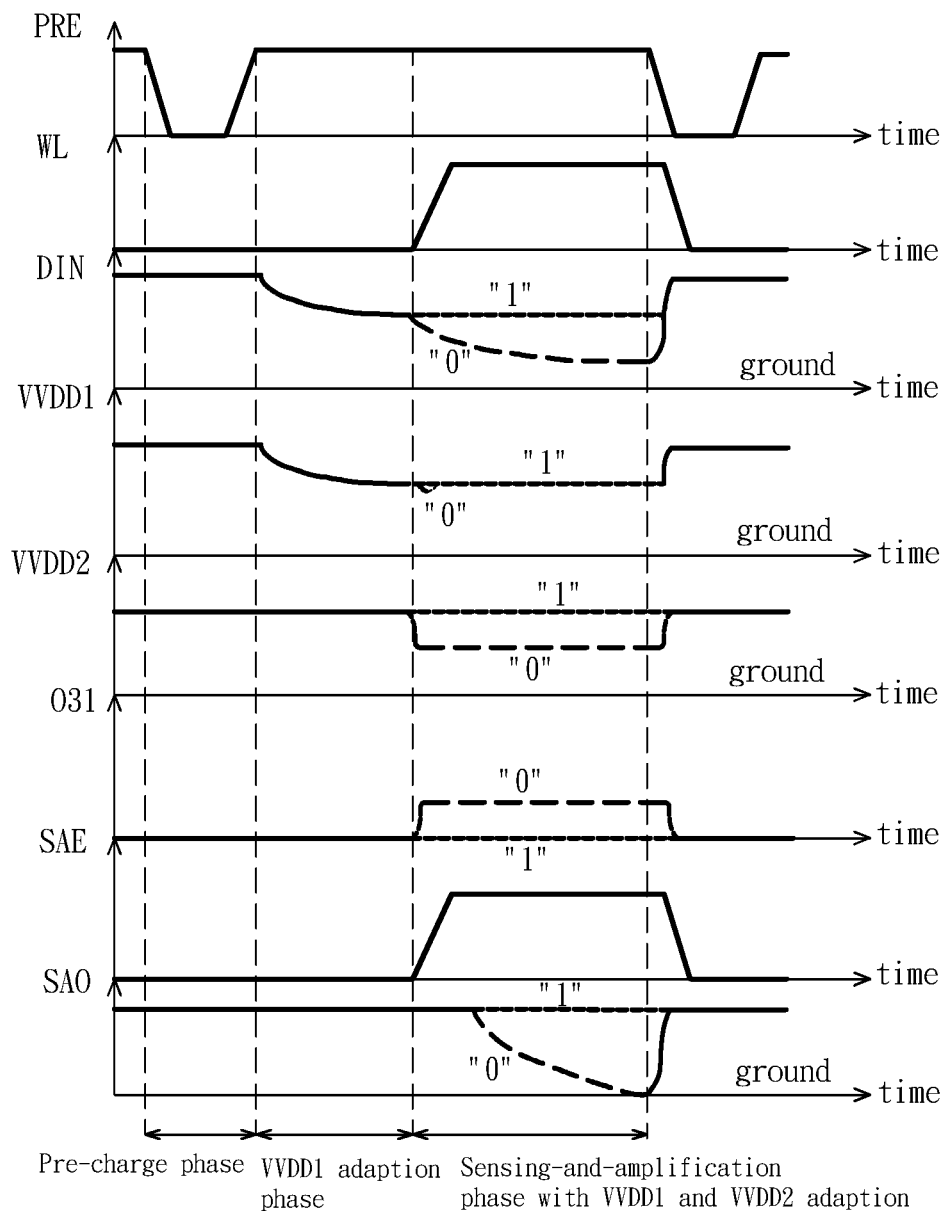
FIG. 4 is a diagram schematically illustrating the waveforms of voltages of a single-ended sense amplifier according to the first embodiment of the present invention.

FIG. 4 shows three operation phases of the single-ended sense amplifier 30 shown in FIG. 3. The first is the pre-charge phase. In this phase, PRE and SAE are asserted low. A PMOS bit line load 34 in the memory array 35 is turned on to pre-charge DIN to the system supply voltage VDD. VS1, VS11, and VS2 are also pulled up to the system supply voltage VDD by some circuit means. In the meantime, output node O31 of circuit 31 is pulled down to the system ground voltage, and SAO is pulled up to VDD. In this phase, the VSVA 33 is disabled to isolate both main virtual power supply nodes VS1 and VS2. The second phase is the leakage-effect-removal phase. In this phase, PRE is asserted high to turn off the PMOS bit line load 34 in the memory array 35. The voltage at DIN and VS11, designated as VDIN, drops gradually due to the PVT- and pattern-dependent leakage of the bit line 36. In the meantime, SAE is still low, and by some circuit means the voltage VVDD1 at VS1 follows to drop gradually due to the PVT- and pattern-dependent leakage of the bit line 36. The VSVA 33 is still disabled in this phase, and VVDD2 is kept at VDD. VDIN and VVDD1 finally stabilize between the system power supply voltage VDD and the system ground voltage VSS before the sense amplifier 30 entering the third phase. The third phase is the final sensing-and-amplification phase through the help of mutual adaptation between VVDD1 and VVDD2. In the third phase, PRE keeps being asserted high, and one word-line WL for accessing the bit cell and SAE for enabling final sensing and amplification are asserted high. The asserted-high SAE also enables VSVA 33 to connect VS1 and VS2 for mutual adaptation between VVDD1 and VVDD2. When reading '1,' VDIN maintains at the same level as in the second phase. Furthermore, the voltage at node O31 keeps low, and the output SAO evaluates as logic '1'. When reading '0,' VDIN goes low and intends to pull up the output O31 of inverter circuit 31 by the charges stored at VS1. When the charges stored at VS1 flow to O31, VVDD1 may also go low so that accordingly the voltage at O31 may not rise to a voltage level high enough to become a logic '1'. Fortunately, because that VS1 and VS2 are connected in this phase, the charges stored at VS2 can replenish the lost charges at VS1. Moreover, VVDD2 will de-generate due to the supporting charges flowing into VS1, and a degenerated VVDD2 happens to weaken the leakage-conducting path from VVDD2 to SAO so that the voltage at SAO can be easily pulled down by a rising voltage at O31. Above two advantages make the sense amplifier 30 in accordance with the present invention more reliable at reading '0' than the prior-art sense amplifier or can operate with a lower minimum supply voltage (Vmin).

With the new circuit design, the single-ended sense amplifier 30 of the present invention achieves another two advantages. The present invention gives the analysis in the followings.

(1) As described before, reading '0' is the critical case of the sense amplifier 30. Thanks to the mutual adaptation between the virtual supply voltage nodes, the charge replenishment to VS1 helps to improve the rising speed of circuit 31, and the degenerated VVDD2 helps to improve the falling speed of circuit 32. Overall, the sense amplifier 30 in accordance with the present invention may have a higher operating speed than the prior-art single-ended sense amplifier 30.

(2) As described, circuits 31 and 32 have internal virtual power supply voltage nodes VS1 and VS2. In other words, both circuits 31 and 32 may have a respective power switch to connect the system power supply voltage node and the virtual power supply voltage nodes. When entering the standby mode, the power switch can be switched off to power down the circuits.

Figure 5:
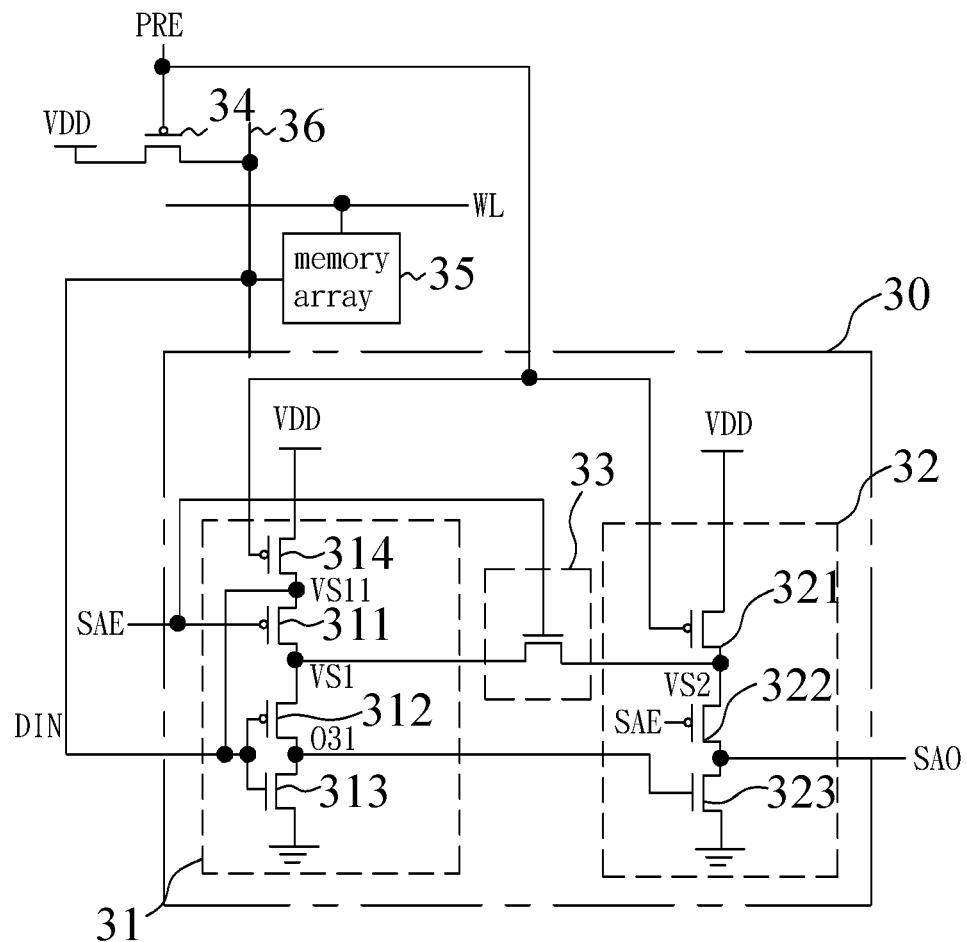
FIG. 5 is a diagram schematically illustrating a single-ended sense amplifier according to the second embodiment of the present invention.

In an embodiment as shown in FIG. 5, the single-ended sense amplifier 30 has one data-input end DIN, one control-input end SAE, one control-input end PRE, and one data-output end SAO. The selected bit line or the data line 36 from the memory array 35 connects to DIN. SAE accepts the sense-amplifier-enabling control signal. PRE is the same control signal for pre-charging the PMOS bit line load 34 of the memory array 35. The single-ended sense amplifier 30 comprises a virtual-supply-voltage-adapted (VVDD-adapted) inverter circuit 31, a VVDD-adapted VLC 32, and an NMOS device 33 acting as a virtual supply voltage adaptation circuit (VSVA). In the VVDD-adapted inverter circuit 31, PMOS devices 311 and 314 act as power switches, and PMOS device 312 and NMOS device 313 form a conventional inverter. The drain node of the PMOS 311 is the main virtual-supply node VS1 of the inverter formed by PMOS device 312 and NMOS device 313. The virtual-supply node VS1 also connects to the source node of PMOS device 312. The input of the inverter formed by PMOS device 312 and NMOS device 313 is the data-input end of the single-ended amplifier 30, i.e., DIN. DIN also connects to the source node of device 311. The source node of device 311 is also the secondary virtual power supply voltage node of inverter circuit 31. The gate terminal of power switch 311 is the control-input end SAE. The gate terminal of power switch 314 is the control-input end PRE, and the system power supply VDD connects to the source node of device 314.

The VVDD-adapted VLC 32 is actually a dynamic inverter with two pre-charge PMOS devices 321 and 322 stacked together. Device 321 is controlled by PRE, and device 322 is controlled by SAE. The intermediate node of the two stacked PMOS devices 321 and 322 is the main virtual supply voltage node VS2 of the VVDD-adapted VLC 32. The main virtual power supply node VS2 of the VDDV-adapted VLC 32 connects to the main virtual power supply node VS1 of the VDDV-adapted inverter circuit 31 through NMOS device 33. In other words, NMOS device 33 is the virtual supply voltage-adaptation circuit (VSVA) in this embodiment of the present invention. The gate terminal of device 33 is controlled by SAE. The voltage at node VS1 is designated as VVDD1, and the voltage at node VS2 is designated as VVDD2.

FIG. 4 shows three operation phases of the single-ended sense amplifier 30 shown in FIG. 5. The first is the pre-charge phase, where DIN is pre-charged to the system supply voltage VDD by a pre-charge PMOS 34 in the memory array 35. In the meantime, PRE and SAE are low to pull up the main virtual supply voltages VVDD1 and VVDD2 of circuits 31 and 32 to VDD. Node O31 of the VVDD-adapted inverter circuit 31 is pulled down to the ground voltage, and SAO is pulled up to VDD. In this phase, NMOS device 33 is turned off to isolate main virtual supply nodes VS1 and VS2. The second phase is the leakage-effect-removal phase. In this phase, the pre-charge PMOS 34 in the memory array 35 is turned off, and PMOS device 314 in circuit 31 and PMOS device 321 in circuit 32 are also turned off by asserting PRE high. The voltage VDIN at DIN and voltage VVDD1 drop gradually due to the PVT- and pattern-dependent leakage of the bit line. NMOS device 33 is still turned off to keep VVDD2 at VDD. VDIN and VVDD1 finally stabilize between VDD and the ground voltage, with VVDD1 being nearly equal to VDIN, before the sense amplifier 30 entering the third phase. VVDD1 adaptation deals with the problem caused by PVT- and pattern-dependent leakage before distinguishing the real signals of reading '0' and reading '1'. The third phase is the final sensing-and-amplification phase through the help of mutual adaptation between VVDD1 and VVDD2. In the third phase, one word-line WL for accessing the bit cell 35 and SAE are asserted high to turn off PMOS device 311 in circuit 31 and PMOS device 322 in circuit 32. Both main virtual supply nodes VS1 and VS2 are floating initially. When reading '1,'

VDIN maintains at the same level as in the second phase. Therefore, the voltage at node O31, designated as VO31, keeps low and SAO keeps high without any access delay. When reading '0,' VDIN goes low to pull up node O31 by the charges stored at VS1. When the charges stored at VS1 flow to node O31, VVDD1 may also go low. Now because that VS1 and VS2 are connected, the charges stored at VS2 can replenish the lost charges at VS1. VVDD2 is degenerated because the charges stored at VS2 flow into VS1. A degenerated VVDD2 weakens the leakage-conducting path from VVDD2 to SAO so that the voltage at SAO can be easily pulled down by a small rising voltage at O31. The access delay of reading '0' is thus improved. Operation of the sense amplifier 30 in accordance with the present invention is more reliable at a lower minimum supply voltage (Vmin). In the standby mode, PRE and SAE keeps at VDD to turn off devices 314 and 311 in circuit 31 and devices 321 and 322 to achieve a super-cutoff effect for powering down the sense amplifier 30.

Figure 6:
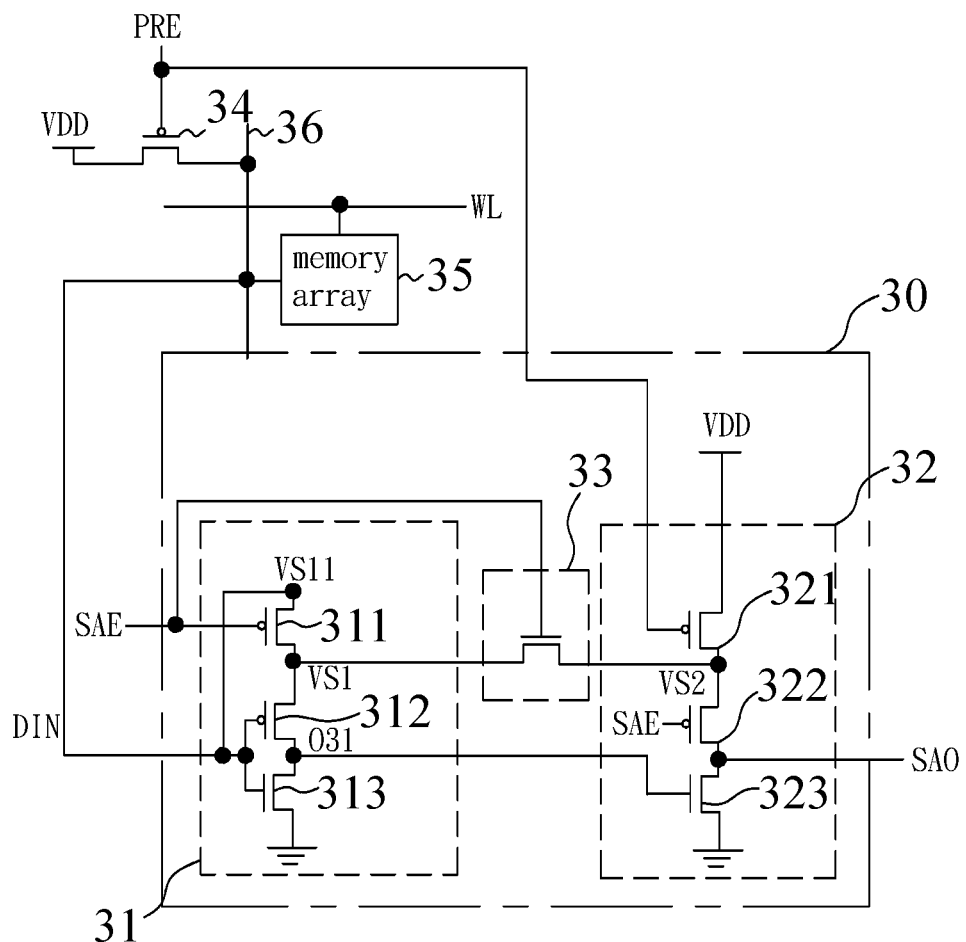
FIG. 6 is a diagram schematically illustrating a single-ended sense amplifier according to the third embodiment of the present invention.

In another embodiment as shown in FIG. 6, the single-ended sense amplifier 30 has one data-input end DIN, one control-input end SAE, one control-input end PRE, and one data-output end SAO. The selected bit line or the data line 36 from the memory array 35 connects to DIN. SAE accepts the sense-amplifier-enabling control signal. PRE is the same control signal for pre-charging the PMOS bit line load 34 of the memory array 35. The single-ended sense amplifier 30 comprises a virtual supply voltage adapted (VVDD-adapted) inverter circuit 31, a VVDD-adapted VLC 32, and NMOS device 33 acting as a virtual supply voltage-adaptation circuit (VSVA). In the VVDD-adapted inverter circuit 31, PMOS device 311 acts as a control switch, and PMOS device 312 and NMOS device 313 forms a conventional inverter. The drain node of PMOS 311 is the main virtual supply node VS1 of the inverter formed by PMOS device 312 and NMOS device 313. The main virtual supply node VS1 also connects to the source node of PMOS device 312. The input of the inverter formed by PMOS device 312 and NMOS device 313 is the data-input end of the single-ended amplifier 30, i.e., DIN. The gate terminal of the control switch 311 connects to the control-input end SAE. The VVDD-adapted VLC 32 is actually a dynamic inverter with two pre-charge PMOS devices 321 and 322 stacked together. Device 321 is controlled by PRE, and device 322 is controlled by SAE. The intermediate node of the two stacked PMOS devices 321 and 322 is the main virtual supply node VS2 of the VVDD-adapted VLC 32. The main virtual supply node VS2 of the VDDV-adapted VLC 32 connects to the main virtual supply node VS1 of the VDDV-adapted inverter circuit 31 through NMOS device 33. In other words, NMOS device 33 is the virtual supply voltage-adaptation circuit (VSVA) in this embodiment of the present invention. The gate terminal of device 33 is controlled by SAE. The voltage at node VS1 is designated as VVDD1, and the voltage at node VS2 is designated as VVDD2. As compared to the sense amplifier 30 in FIG. 6, the sense amplifier 30 in FIG. 5 has an additional PMOS device 314 only for accelerating the pre-charging of DIN and VS11. Therefore, these two sense amplifiers 30 have the same operation principles, which will not be explained in detail herein.

The PMOS bit line load 34 in the memory array 35 and PMOS 311 in circuit 31 perform as stacked power switches for the VVDD-adapted inverter circuit 31 during the standby mode. Meanwhile, the two pre-charge PMOS devices 321 and 322 in circuit 32 also perform as the stacked power switches of the VVDD-adapted VLC 32 during the standby mode. In the standby mode, PRE and SAE are high to turn off PMOS devices 311, 321, and 322. Therefore, there is a strong stacking effect in both circuits 31 and 32 to super cutoff the standby-leakage current.

Figure 7:
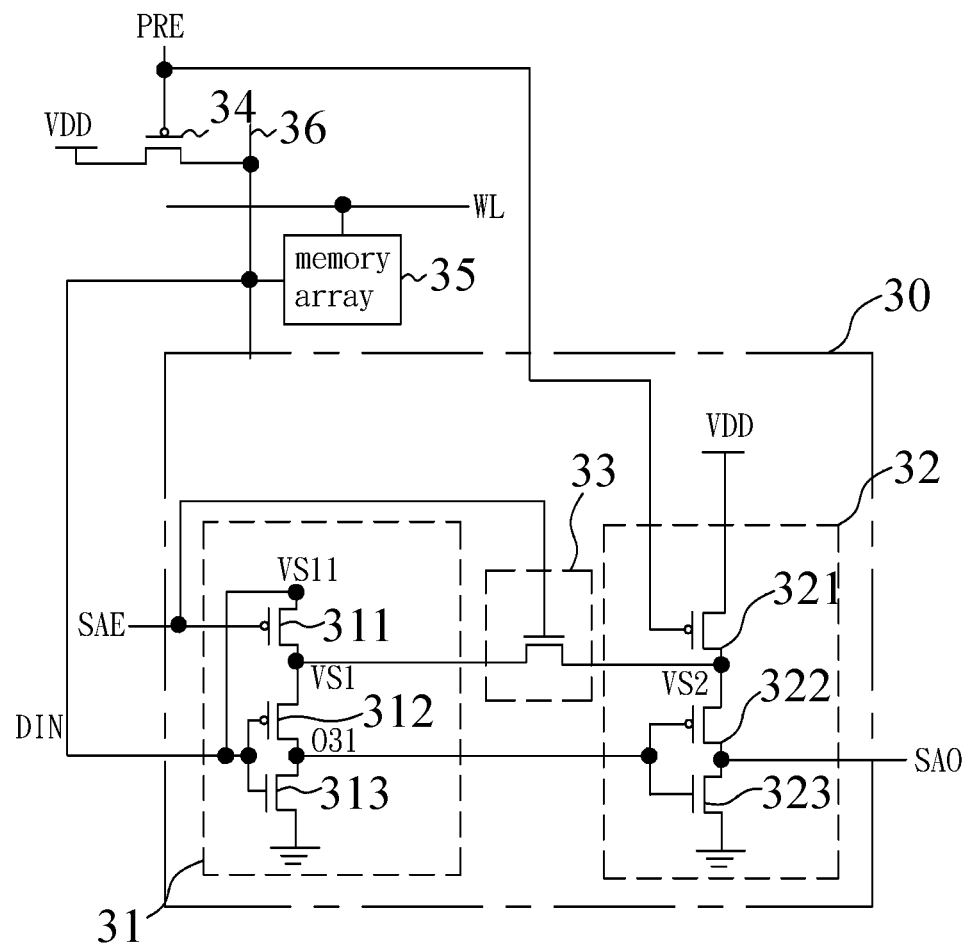
FIG. 7 is a diagram schematically illustrating a single-ended sense amplifier according to the fourth embodiment of the present invention.

In another embodiment as shown in FIG. 7, the single-ended sense amplifier 30 has one data-input end DIN, one control-input end SAE, one control-input end PRE, and one data-output end SAO. The selected bit line or the data line 36 from the memory array 35 connects to DIN. SAE accepts the sense-amplifier-enabling control signal. PRE is the same control signal for pre-charging the PMOS bit line load 34 of the memory array 35. The single-ended sense amplifier 30 comprises a virtual supply voltage adapted (VVDD-adapted) inverter circuit 31, a VVDD-adapted VLC 32, and an NMOS device 33 acting as a virtual supply voltage-adaptation circuit (VSVA). In the VVDD-adapted inverter circuit 31, PMOS device 311 acts as a control switch, and PMOS device 312 and NMOS device 313 forms a conventional inverter. The drain node of PMOS 311 is the main virtual supply node VS1 of the inverter formed by PMOS device 312 and NMOS device 313. The main virtual supply node VS1 also connects to the source node of PMOS device 312. The input of the inverter formed by PMOS device 312 and NMOS device 313 is the data-input end of the single-ended amplifier 30, i.e., DIN. The gate terminal of the control switch 311 connects to the control-input end SAE. The VVDD-adapted VLC 32 is actually a dynamic inverter with two pre-charge PMOS devices 321 and 322 stacked together. Device 321 is controlled by PRE, and device 322 is controlled by the output O31 of the VVDD-adapted inverter circuit 31. The intermediate node of the two stacked PMOS devices 321 and 322 is the main virtual supply node VS2 of the VVDD-adapted VLC 32. The main virtual supply node VS2 of the VDDV-adapted VLC 32 connects to the main virtual supply node VS1 of the VDDV-adapted inverter circuit 31 through NMOS device 33. The voltage at node VS1 is designated as VVDD1, and the voltage at node VS2 is designated as VVDD2. Compared to the sense amplifier 30 in FIG. 6, device 323 in FIG. 6 connects to the output of the VVDD-adapted inverter circuit 31 instead of SAE. It is obvious that the circuit in FIG. 7 can perform correctly as the circuit in FIG. 6. These two sense amplifiers 30 have the same operation principles, which will not be explained in detail herein.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A single-ended sense amplifier sequentially performing a first operation phase, a second operation phase, and a third operation phase and comprising:

a virtual-supply-voltage-adapted inverter circuit, coupled to a data line of a memory array, having a first virtual-supply node and a second virtual-supply node, receiving a data signal input from the data line of the memory array and a sensing-operation-enabling signal input, and generating a pre-amplified signal output;

a virtual-supply-voltage-adapted voltage-level converter, coupled to the virtual-supply-voltage-adapted inverter circuit, having a third virtual-supply node, receiving the pre-amplified signal output of the virtual-supply-voltage-adapted inverter circuit, a pre-charging control signal input being the same as a control signal input of a pre-charging data-line load of the memory array, and the sensing-operation-enabling signal input, and generating a final amplified signal output; and a virtual-supply-voltage-adaption circuit receiving the sensing-operation-enabling signal input to link or to dis-link the first virtual-supply node of the virtual-supply-voltage-adapted inverter circuit and the third virtual-supply node of the virtual-supply-voltage-adapted voltage-level converter, wherein in the first operation phase, the pre-charging control signal input is asserted, the sensing-operation-enabling signal input is dis-asserted, the virtual-supply-voltage-adapted inverter circuit pre-charges its own the first virtual-supply node to a system supply voltage, the virtual-supply-voltage-adaption circuit is turned off to dis-link the first virtual-supply node of the virtual-supply-voltage-adapted inverter circuit and the third virtual-supply node of the virtual-supply-voltage-adapted voltage-level converter, and the virtual-supply-voltage-adapted voltage-level converter pre-charges its own the third virtual-supply node to the system supply voltage, wherein in the second operation phase, the pre-charging control signal input is dis-asserted, the sensing-operation-enabling signal input is asserted, the virtual-supply-voltage-adapted inverter circuit adapts its own virtual-supply-node voltage in accordance with the data signal input being subject a leakage current of the data line, the virtual-supply-voltage-adaption circuit is turned off to dis-link the first virtual-supply node of the virtual-supply-voltage-adapted inverter circuit and the third virtual-supply node of the virtual-supply-voltage-adapted voltage-level converter, and the virtual-supply-voltage-adapted voltage-level converter keeps its own virtual-supply-node voltage at the system supply voltage, wherein in the third operation phase, the pre-charging control signal input is dis-asserted, the sensing-operation-enabling signal input is asserted, the virtual-supply-voltage-adapted inverter circuit senses and pre-amplifies the data signal input in accordance with data stored in an accessed memory bit-cell of the memory array to generate the pre-amplified signal output, the virtual-supply-voltage-adaption circuit is turned on to link the first virtual-supply node of the virtual-supply-voltage-adapted inverter circuit and the third virtual-supply node of the virtual-supply-voltage-adapted voltage-level converter, and the virtual-supply-voltage-adapted voltage-level converter adapts its own virtual-supply-node voltage in accordance with the data signal input and the data stored in the accessed memory bit-cell and senses and amplifies the pre-amplified signal output from the virtual-supply-voltage-adapted inverter circuit to generate the final amplified signal output.

2. The single-ended sense amplifier according to claim 1, wherein the inverter circuit comprises a first P-channel metal-oxide-semiconductor field effect transistor (PMOSFET), a second P-channel metal-oxide-semiconductor field effect transistor (PMOSFET), a third P-channel metal-oxide-semiconductor field effect transistor (PMOSFET), and an N-channel metal-oxide-semiconductor field effect transistor (NMOSFET) that collectively form a cascade down to ground.

3. The single-ended sense amplifier according to claim 2, wherein a source terminal, a gate terminal, and a drain terminal of the first PMOSFET receive the system supply voltage, the pre-charging control signal input, and the data signal input, respectively.

4. The single-ended sense amplifier according to claim 2, wherein a source terminal and a gate terminal of the second PMOSFET respectively receive the data signal input and the sensing-operation-enabling signal input, and a drain terminal of the second PMOSFET connects to a source terminal of the third PMOSFET.

5. The single-ended sense amplifier according to claim 2, wherein a source terminal and a drain terminal of the third PMOSFET respectively connect to a drain terminal of the second PMOSFET and a drain terminal of the NMOSFET, and a gate terminal of the third PMOSFET receives the data signal input.

6. The single-ended sense amplifier according to claim 2, wherein a source terminal and a drain terminal of the NMOSFET respectively connect to ground and a drain terminal of the third PMOSFET, and a gate terminal of the NMOSFET receives the data signal input.

7. The single-ended sense amplifier according to claim 2, wherein the first virtual-supply node is a drain terminal of the second PMOSFET and the second virtual-supply node is a drain terminal of the first PMOSFET of the inverter circuit.

8. The single-ended sense amplifier according to claim 2, wherein a signal output node of the inverter circuit is a drain terminal of the NMOSFET, and the signal output node generates the pre-amplified signal output in the third operation phase.

9. The single-ended sense amplifier according to claim 1, wherein the inverter circuit comprises a first P-channel metal-oxide-semiconductor field effect transistor (PMOSFET), a second P-channel metal-oxide-semiconductor field effect transistor (PMOSFET), and an N-channel metal-oxide-semiconductor field effect transistor (NMOSFET), which collectively form a cascade down to ground.

10. The single-ended sense amplifier according to claim 9, wherein a source terminal and a gate terminal of the first PMOSFET respectively receive the data signal input and the sensing-operation-enabling signal, and a drain terminal of the first PMOSFET connects to a source terminal of the second PMOSFET.

11. The single-ended sense amplifier according to claim 9, wherein a source terminal and a drain terminal of the second PMOSFET respectively connect to a drain terminal of the first PMOSFET and a drain terminal of the NMOSFET, and a gate terminal of the second PMOSFET receives the data signal input.

12. The single-ended sense amplifier according to claim 9, wherein a source terminal and a drain terminal of the NMOSFET respectively connect to ground and a drain terminal of the second PMOSFET, and a gate terminal of the NMOSFET receives the data signal input.

13. The single-ended sense amplifier according to claim 9, wherein the first virtual-supply node is a source terminal of the second PMOSFET and the second virtual-supply node is a source terminal of the first PMOSFET.

14. The single-ended sense amplifier according to claim 9, wherein a signal output node of the inverter circuit is a drain terminal of the NMOSFET, and the signal output node generates the pre-amplified signal output in the third operation phase.

15. The single-ended sense amplifier according to claim 1, wherein the voltage-level converter comprises a first P-channel metal-oxide-semiconductor field effect transistor (PMOSFET), a second P-channel metal-oxide-semiconductor field effect transistor (PMOSFET), and an N-channel metal-oxide-semiconductor field effect transistor (NMOS) that collectively form a cascade down to ground.

16. The single-ended sense amplifier according to claim 15, wherein a source terminal and a gate terminal of the first PMOSFET respectively receive the system supply voltage and the pre-charging control signal input, and a drain terminal of the first PMOSFET connects to a source terminal of the second PMOSFET.

17. The single-ended sense amplifier according to claim 15, wherein a source terminal and a drain terminal of the second PMOSFET respectively connect to a drain terminal of the first PMOSFET and a drain terminal of the NMOSFET, and a gate terminal of the second PMOSFET receives the sensing-operation-enabling signal input.

18. The single-ended sense amplifier according to claim 15, wherein a source terminal, a gate terminal, and a drain terminal of the NMOSFET connect to ground, a signal output node of the inverter circuit, and a drain terminal of the second PMOSFET, respectively.

19. The single-ended sense amplifier according to claim 15, wherein the third virtual-supply node of the voltage-level converter is a drain terminal of the first PMOSFET.

20. The single-ended sense amplifier according to claim 15, wherein a signal output node of the voltage-level converter is a drain terminal of the NMOSFET, and the signal output node generates the final amplified signal output in the third operation phase.

21. The single-ended sense amplifier according to claim 1, wherein the voltage-level converter comprises a first P-channel metal-oxide-semiconductor field effect transistor (PMOSFET), a second P-channel metal-oxide-semiconductor field effect transistor (PMOSFET), and an N-channel metal-oxide-semiconductor field effect transistor (NMOSFET) that collectively form a cascade down to ground.

22. The single-ended sense amplifier according to claim 21, wherein a source terminal and a gate terminal of the first PMOSFET respectively receive the system supply voltage and the pre-charging control signal input, and a drain terminal of the first PMOSFET connects to a source terminal of the second PMOSFET.

23. The single-ended sense amplifier according to claim 21, wherein a source terminal, a gate terminal, and a drain terminal of the second PMOSFET respectively connect to a drain terminal of the first PMOSFET, a signal output node of the inverter circuit, and a drain terminal of the NMOSFET.

24. The single-ended sense amplifier according to claim 21, wherein a source terminal, a gate terminal, and a drain terminal of the NMOSFET respectively connect to ground, a signal output node of the inverter circuit, and a drain terminal of the second PMOSFET.

25. The single-ended sense amplifier according to claim 21, wherein the third virtual-supply node of the voltage-level converter is a drain terminal of the first PMOSFET.

26. The single-ended sense amplifier according to claim 21, wherein a signal output node of the voltage-level converter is a drain terminal of the NMOSFET, and the signal output node generates the final amplified signal output in the third operation phase.

27. The single-ended sense amplifier according to claim 1, wherein the virtual-supply-voltage-adaptation circuit comprises an N-channel metal-oxide-semiconductor field effect transistor (NMOSFET).

28. The single-ended sense amplifier according to claim 27, wherein a source terminal and a drain terminal of the NMOSFET respectively connect to the first virtual-supply node and the third virtual-supply node, and a gate terminal of the NMOSFET receives the sensing-operation-enabling signal input.

* * * * *